United States Patent
Quach et al.

(10) Patent No.: US 8,787,110 B2
(45) Date of Patent: Jul. 22, 2014

(54) REALIGNMENT OF COMMAND SLOTS AFTER CLOCK STOP EXIT

(75) Inventors: Tuan M. Quach, Fullerton, CA (US); Victor V. Tran, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 162 days.

(21) Appl. No.: 13/537,688

(22) Filed: Jun. 29, 2012

(65) Prior Publication Data
US 2014/0003184 A1    Jan. 2, 2014

(51) Int. Cl.
*G11C 8/00* (2006.01)

(52) U.S. Cl.
USPC ...................................... 365/230.08

(58) Field of Classification Search
None
See application file for complete search history.

(56) References Cited

U.S. PATENT DOCUMENTS

| | | | | |
|---|---|---|---|---|
| 6,991,301 | B2 * | 1/2006 | Aurich et al. | 303/15 |
| 2003/0014578 | A1 * | 1/2003 | Pax | 710/100 |
| 2004/0046442 | A1 * | 3/2004 | Aurich et al. | 303/7 |
| 2009/0327596 | A1 * | 12/2009 | Christenson et al. | 711/105 |
| 2011/0263297 | A1 * | 10/2011 | Kaaja et al. | 455/566 |
| 2012/0250433 | A1 * | 10/2012 | Jeon | 365/193 |
| 2013/0054884 | A1 * | 2/2013 | Gupta et al. | 711/105 |
| 2013/0151796 | A1 * | 6/2013 | Gupta | 711/154 |
| 2013/0346721 | A1 * | 12/2013 | Giovannini et al. | 711/167 |
| 2014/0003182 | A1 * | 1/2014 | Quach et al. | 365/230.02 |

* cited by examiner

*Primary Examiner* — Hoai V Ho
*Assistant Examiner* — Pablo Huerta
(74) *Attorney, Agent, or Firm* — Schwabe, Williamson & Wyatt, P.C.

(57) ABSTRACT

Described herein are embodiments of dynamic command slot realignment after clock stop exit. An apparatus configured for dynamic command slot realignment after clock stop exit may include memory including a first memory module configured to receive commands over a first channel via a first command slot and a second memory module configured to receive commands over a second channel via a second command slot, and a memory buffer configured to receive a clock sync command targeting the first command slot, and perform a write pointer exchange in response to detecting the clock sync command in the second command slot to realign the first command slot and the second command slot. Other embodiments may be described and/or claimed.

25 Claims, 7 Drawing Sheets

REALIGNMENT OF COMMAND SLOTS AFTER CLOCK STOP EXIT

TECHNICAL FIELD

Embodiments of the present disclosure relate generally to the field of memory buffers, and more particularly, to memory buffers configured to realign command slots after clock stop exit.

BACKGROUND

Figure 1:
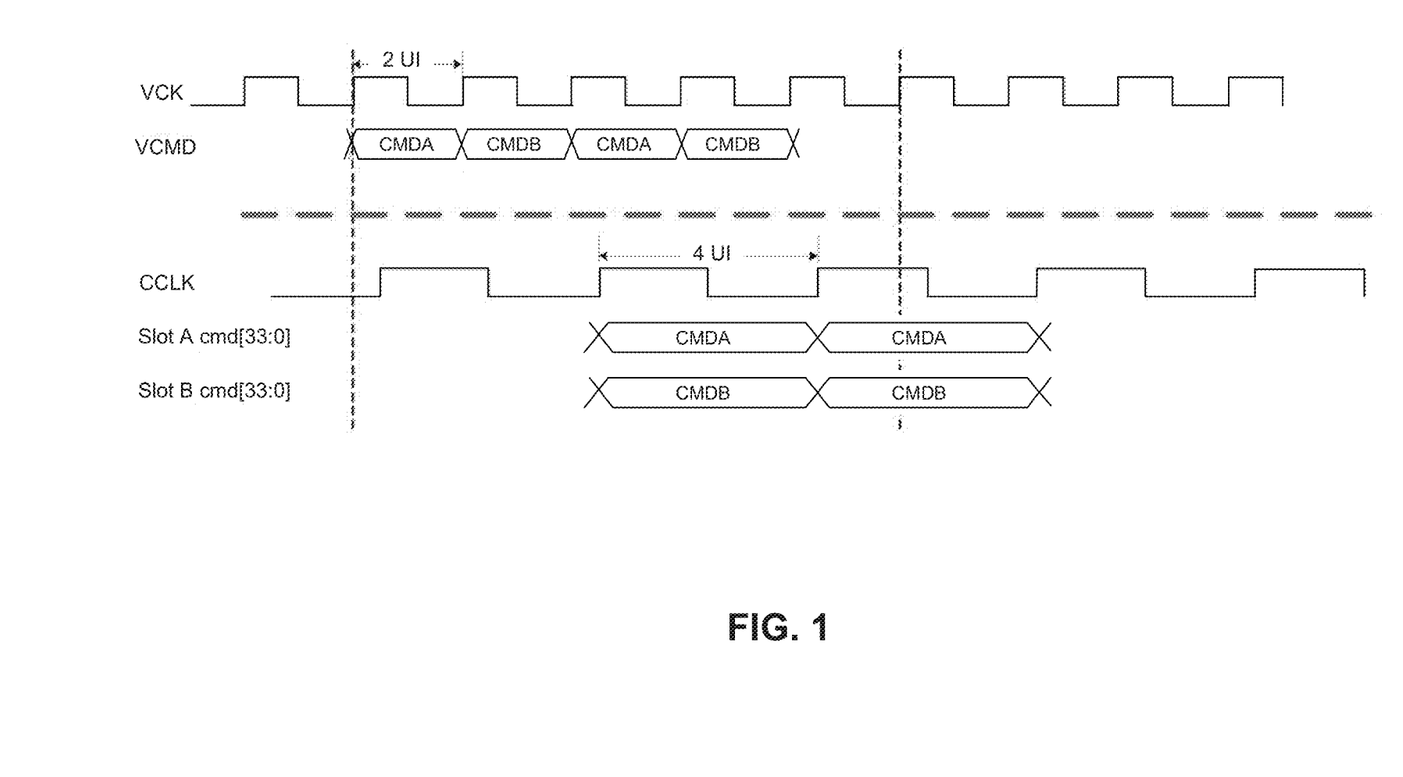
FIG. 1 is a timing diagram illustrating link training for command busses for command slot A and command slot B.

In some double-data rate (DDR) memory systems, command busses are trained using a link training procedure on power-on of the system to align the command slots targeting specific memory channels. For example, as shown in FIG. 1, during link training, commands (CMDA) on the memory bus (VCMD) targeting a first DDR channel may be trained for a first slot (slot A), while commands (CMDB) targeting a second DDR channel may be trained for a second slot (slot B).

To save power in some DDR memory systems, a memory command clock (VCK) and any high speed logic associated with the paths using the memory command clock may be shut down, while the core clock (CCLK) continues to run. On resuming the memory command clock, any first-in, first-out (FIFO) storage components on the memory command clock must be started with the same read/write pointer separation as before entering clock stop. After exiting clock stop and resuming the memory command clock, however, the command slots may no longer be aligned—a command issued for a first slot could be in the second slot, and vice versa. This non-determinism may result in a failure, requiring a re-training of the link, which may negatively impact system performance and clock stop exit time requirements.

BRIEF DESCRIPTION OF THE DRAWINGS

Embodiments of the present disclosure will be described by way of example embodiments, but not limitations, illustrated in the accompanying drawings in which like references denote similar elements, and in which.

all in accordance with embodiments of the present disclosure.

DETAILED DESCRIPTION

Described herein are embodiments of a memory buffer configured to realign command slots after clock stop exit, a system including the memory buffer configured to realign command slots after clock stop exit, a method for realigning command slots after clock stop exit, and computer-readable media having instructions that, if executed by one or more processors, cause an apparatus to perform a method for realigning command slots after clock stop exit.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various aspects of the illustrative implementations are described herein using terms commonly employed by those skilled in the art to convey the substance of their work to others skilled in the art. It will be apparent to those skilled in the art, however, that embodiments of the present invention may be practiced with only some of the described aspects. For purposes of explanation, specific numbers, materials and configurations are set forth in order to provide a thorough understanding of the illustrative implementations. It will be apparent to one skilled in the art, however, that embodiments of the present invention may be practiced without the specific details. In other instances, well-known features are omitted or simplified in order not to obscure the illustrative implementations.

Further, various operations are described as multiple discrete operations, in turn, in a manner that is most helpful in understanding the illustrative embodiments; however, the order of description should not be construed as to imply that these operations are necessarily order dependent. In particular, these operations need not be performed in the order of presentation. Moreover, methods within the scope of this disclosure may include more or fewer steps than those described.

For the purposes of the present disclosure, the phrase "A and/or B" means (A), (B), or (A and B). The phrase "A/B" means (A), (B), or (A and B), similar to the phrase "A and/or B". The phrase "at least one of A, B and C" means (A), (B), (C), (A and B), (A and C), (B and C) or (A, B and C). The phrase "(A) B" means (B) or (A and B), that is, A is optional.

The description may use the phrases "in an embodiment," or "in various embodiments," which may each refer to one or more of the same or different embodiments. Furthermore, the terms "comprising," "including," "having," and the like, as used with respect to embodiments of the present disclosure, are synonymous.

Various entities may be introduced and described with respect to the operations they perform. It will be understood that these entities may include hardware, software, and/or firmware elements that are cooperatively configured to provide the described operations.

Figure 2:
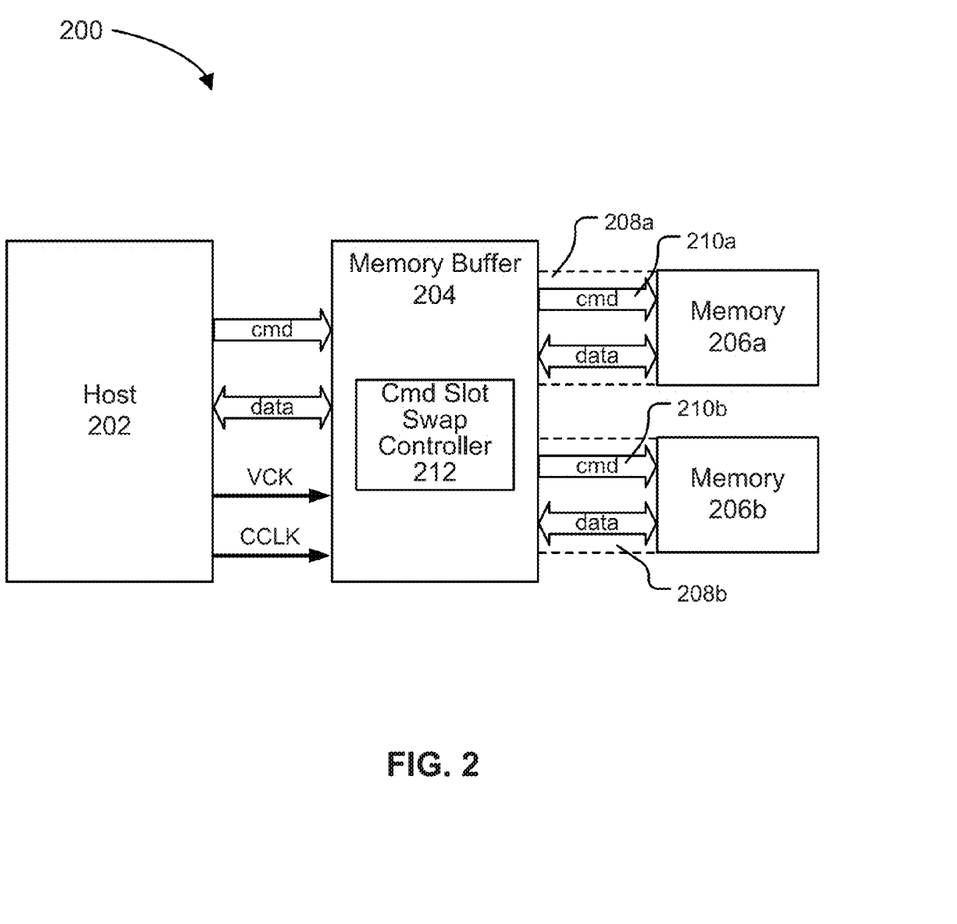
FIG. 2 illustrates an example computing system including a command slot swap controller for dynamic realignment of command slots after clock stop exit.

FIG. 2 illustrates an example computing system 200 configured to realign command slots after clock stop exit, in accordance with various embodiments. The system 200 may include a host 202 coupled with a memory buffer 204, which is in turn coupled with a dual-channel memory including memory modules 206a, 206b by a link including channels 208a, 208b to transmit commands to the memory modules 206a, 206b and data between the memory buffer 204 and the memory modules 206a, 206b. The memory buffer 204 may be located in a chipset of the system 200 or may be in a discrete component coupled to the memory modules 206a, 206b.

In various embodiments, the host 204 comprises one or more processors. The one or more processors may include one core or multiple cores. In some embodiments, the system 200 may be a multiprocessor system where each of the processors has one or multiple cores. In various embodiments, the host 204 includes an embedded a memory controller, but in other embodiments, a memory controller (not shown) may be included a chipset of the system 200. In other embodiments, the host 204 may be an entity, e.g., an application, an operating system, etc., that generates data and memory access commands and transmits the data and memory access commands to the memory buffer 204. As used herein, memory access commands may include requests for a memory access, e.g., a read, a write, etc., directed to one or more of the memory modules 206a, 206b via the memory buffer 204.

The memory modules 206a, 206b may each comprise double data rate (DDR) memory. In various ones of these embodiments, the memory modules 206a, 206b may be DDR synchronous dynamic random access memory (SDRAM). In other embodiments, the memory modules 206a, 206b may be another type of memory such as graphics DDR memory. In various embodiments, the memory modules 206a, 206b may be coupled to the host 202 via the memory buffer 204 by a voltage-mode, single-ended bus (VMSE).

On power-on of the system 200, the command busses 210a, 210b may be trained using a link training procedure to align the command slots targeting specific memory channels 208a, 208b. Referring again to FIG. 1, for example, during link training, commands (CMDA) targeting a first DDR channel may be trained for a first slot (slot A), while commands (CMDA) targeting a second DDR channel may be trained for a second slot (slot B). In various embodiments, the system 200 may be configured to switch to a power saving mode in which a memory command clock (VCK), and any high speed logic associated with the paths using the memory command clock, may be shut down, while the core clock (CCLK) continues to run. This power saving mode may be referred to herein as "clock stop mode."

On exiting the clock stop mode, the host 202 may again drive the memory command clock VCK. In general, it is desirable for the memory modules 206a, 206b to be started with the same read/write pointer separation as before entering clock stop. In various embodiments, however, the memory command clock VCK may be twice the speed of the core clock CCLK, or more, and so when the memory command clock VCK resumes toggling, any drift could result in the VCK toggling in either phase of the core clock CCLK. As exiting the clock stop mode may be non-deterministic, there is the possibility that the command slots may no longer be aligned such that a command issued for a first slot could be in the second slot, and vice versa.

Figure 3:
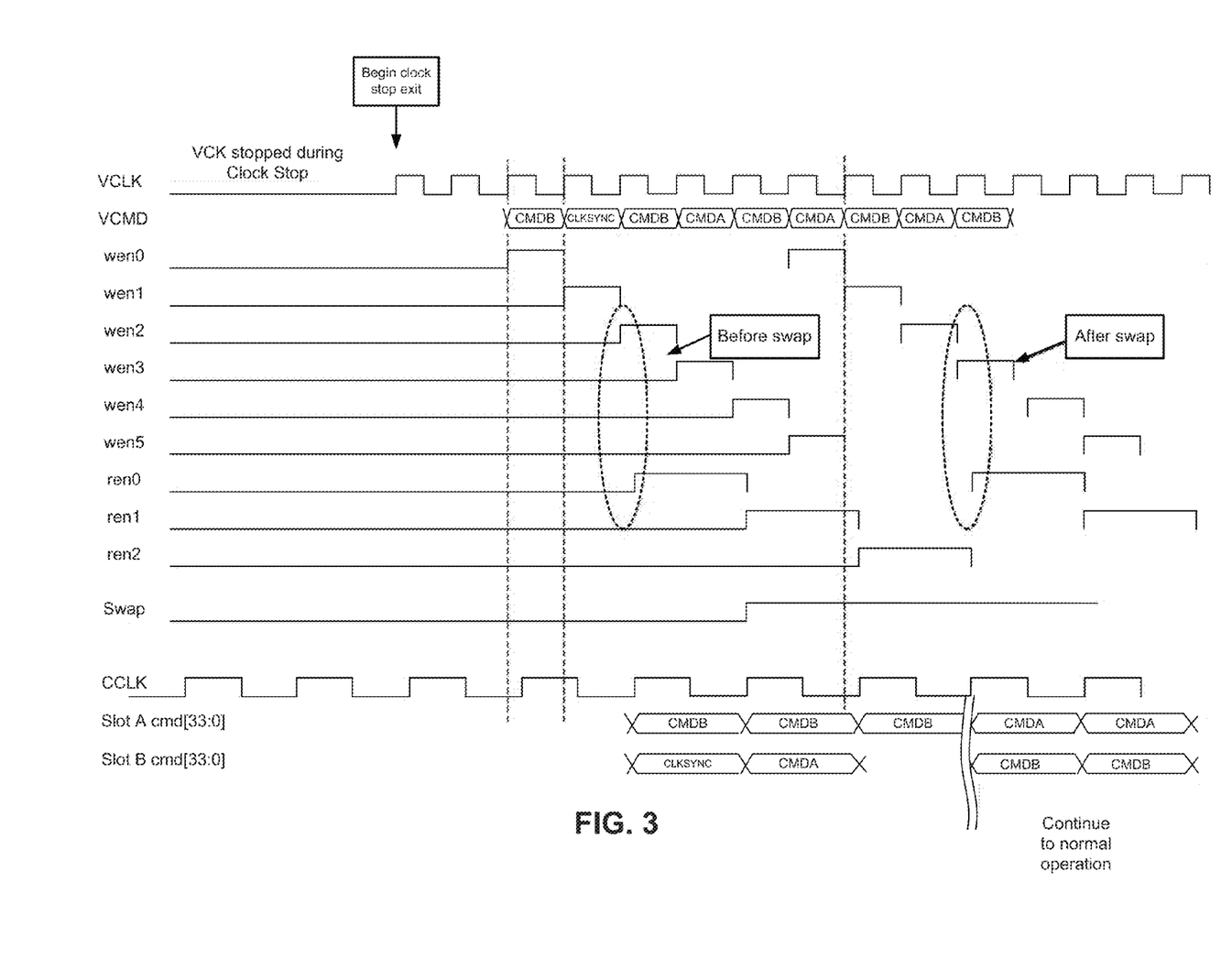
FIG. 3 is a timing diagram illustrating dynamic realignment of command slots after clock stop exit.

Referring now to FIG. 3, with continued reference to the system 100 of FIG. 2, illustrated is an example of command slot misalignment. As can be seen, during clock stop, the memory command clock VCK is disabled, while the core clock CCLK continues to toggle. On clock stop exit, the memory command clock VCK resumes toggling, but starts toggling in the low phase of the core clock CCLK, which causes a command issued for slot B to show up at slot A, and the clock sync command, which is a command issued for slot A, to show up on slot B.

Rather than performing link training to realign the command slots, the memory buffer 204 may include a command slot swap controller 212 configured to dynamically realign command slots after clock stop exit. In various embodiments, the command slot swap controller 212 may be configured to dynamically realign the command slots by a write pointer exchange operation in which the command slot swap controller 212 detects the clock sync command CLKSYNC on the command B slot (rather the correct command A slot), issues a swap signal for causing the write enable signals to swap, as shown, resulting in the commands being in the correct slots. In various embodiments, the system 200 may then continue to normal operation, with or without additional wake up operations.

Figure 4:
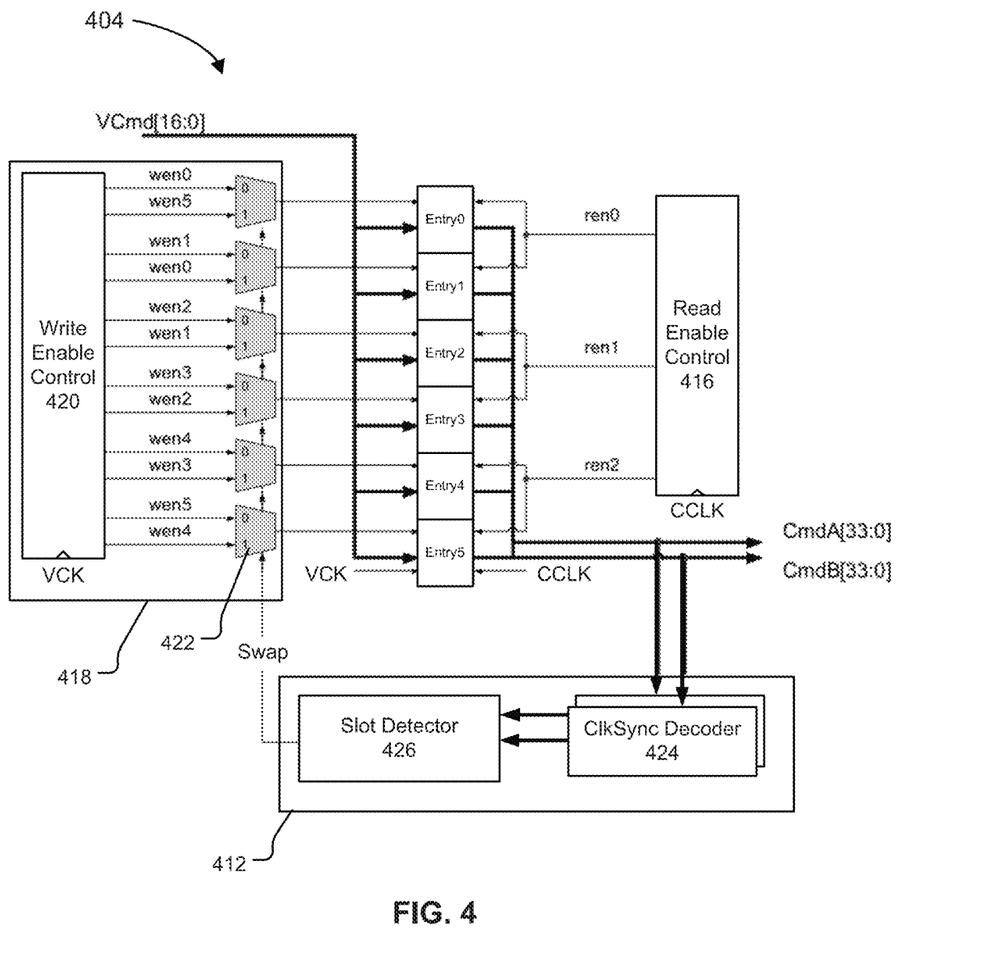
FIG. 4 illustrates an example memory buffer including a command slot swap controller for dynamic realignment of command slots after clock stop exit.

FIG. 4 illustrates a more detailed example of serial in, parallel out (SIPO) write enable memory buffer 404 including a command slot swap controller 412 configured to dynamically realign command slots after clock stop exit, in accordance with various embodiments. In various embodiments, the memory buffer 404 may be included in a computing system such as, for example, the computing system 200 of FIG. 2. As shown in FIG. 4, the memory buffer 404 includes a read enable controller 416 configured to output a plurality of read enable signals ren0, rent, ren2, and a write enable block 418 including a write enable controller 420 driving a plurality of multiplexers 422 with a plurality of write enable signals wen0, went, wen2, wen3, wen4, and wen5. The command slot swap controller 412 includes a clock sync decoder 424 and a slot detector 426, one or both of which may include hardware or firmware. In some embodiments, the clock sync decoder 424 and/or the slot detector 426 may include hardware, software, and/or firmware elements that are cooperatively configured to provide the operations described herein.

On exiting the clock stop mode, the host resumes toggling the memory command clock VCK and issues a clock sync command (VCmd) targeting slot A. A clock sync decoder 424 decodes the clock sync command on the command slot A (CmdA) and command slot B (CmdB) lines. A slot detector 426 is configured to detect whether the clock sync command is in command slot B rather than command slot A, and if the clock sync command is detected in command slot B, the slot detector 426 is configured to output a swap signal to the multiplexers 422 of the write enable block 418, which causes the write pointers to swap to realign the command slots.

Figure 5:
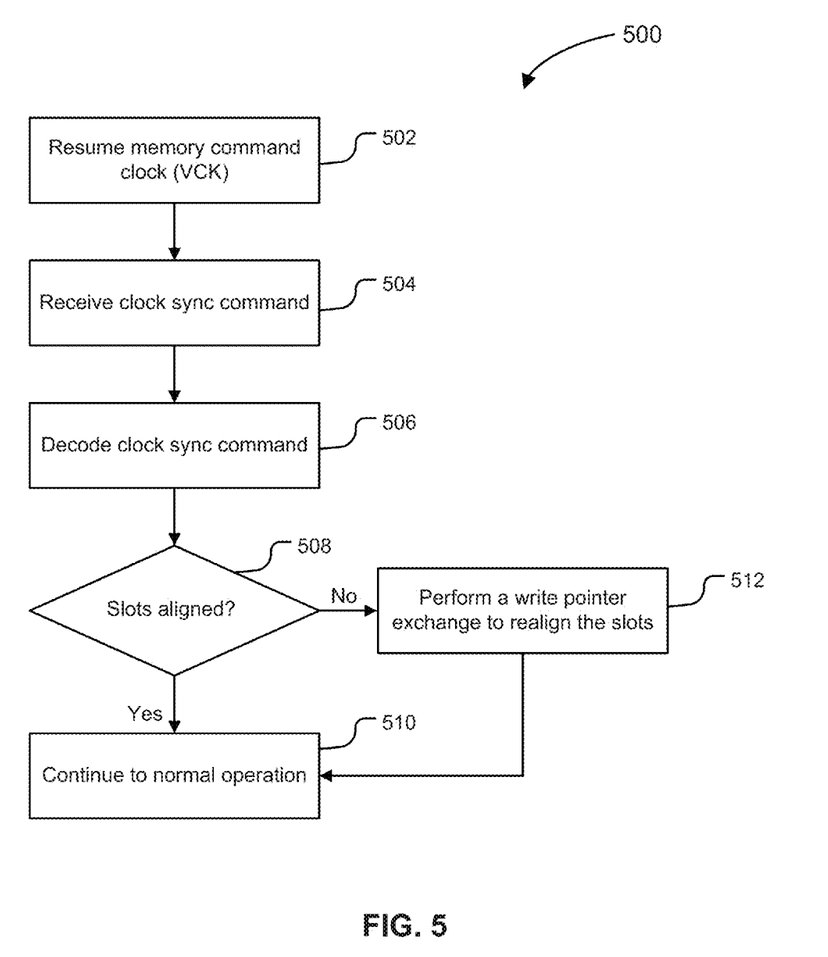
FIG. 5 is a flow chart depicting a method for dynamic realignment of command slots after clock stop exit.

FIG. 5 is a flow chart depicting a method 500 for dynamically realigning command slots after clock stop exit, which may be performed by a computing system (such as, for example, computing system 200) in accordance with the embodiments described herein. The method 500 may include one or more functions, operations, or actions as is illustrated by block 502, 504, 506, 508, 510, and/or 512.

Processing for the method 500 may start with block 502 by resuming a memory command clock (VCK), which may be performed by a host of a computing system on exiting a clock stop mode. The memory command clock may be received by a memory buffer including a command slot swap controller and situated between the host and a plurality of DDR memory modules. The memory modules may include a first memory module configured to receive commands over a first channel via a first command slot and a second memory module configured to receive commands over a second channel via a second command slot.

The method 500 may proceed to block 504 by receiving a clock sync command targeting a first command slot. In various embodiments, the clock sync command may be issued by a host and received by a command slot swap controller.

The method 500 may proceed to block 506 by decoding the clock sync command. The decoding may be performed by a clock sync decoder of a command slot swap controller of a memory buffer.

The method 500 may proceed to block 508 by determining whether the command slots are aligned. In various embodiments, the determining may include detecting whether the clock sync command is in the first command slot or the second command slot. The determining may be performed by a slot detector of a command slot swap controller of a memory buffer.

If the clock sync command is detected on the second command slot, the method 500 may proceed to block 510 by performing a write pointer exchange to realign the command slots. The method 500 may then proceed to block 512 by continuing normal operation of the computing system.

If, on the other hand, the clock sync command is detected in the first command slot, the method 500 may proceed from block 508 to block 512 by continuing normal operation of the computing system.

Figure 6:
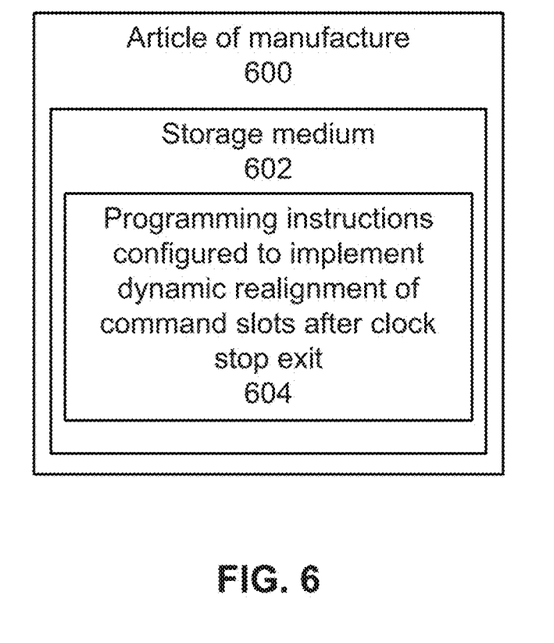
FIG. 6 illustrates an article of manufacture having programming instructions configured to cause an apparatus to practice some or all aspects of dynamic realignment of command slots after clock stop exit (of the method of FIG. 5, for example)

In various embodiments, an article of manufacture may be employed to implement one or more methods as disclosed herein. FIG. 6 describes an example article of manufacture 600. As shown, the article of manufacture 600 may include a computer-readable non-transitory storage medium 602 and a storage medium 604. The programming instructions 604 may enable an apparatus, in response to their execution by the apparatus, to perform various operations described herein. For example, the non-transitory storage medium 602 may include programming instructions 604 configured to cause an apparatus or system to practice some or all aspects of dynamic command slot swap after clock stop exit of the method of FIG. 5, for example, in accordance with embodiments of the present disclosure.

The non-transitory storage medium 602 may represent a broad range of persistent storage medium known in the art, including but not limited to flash memory, dynamic random access memory, static random access memory, an optical disk, a magnetic disk, etc.

Figure 7:
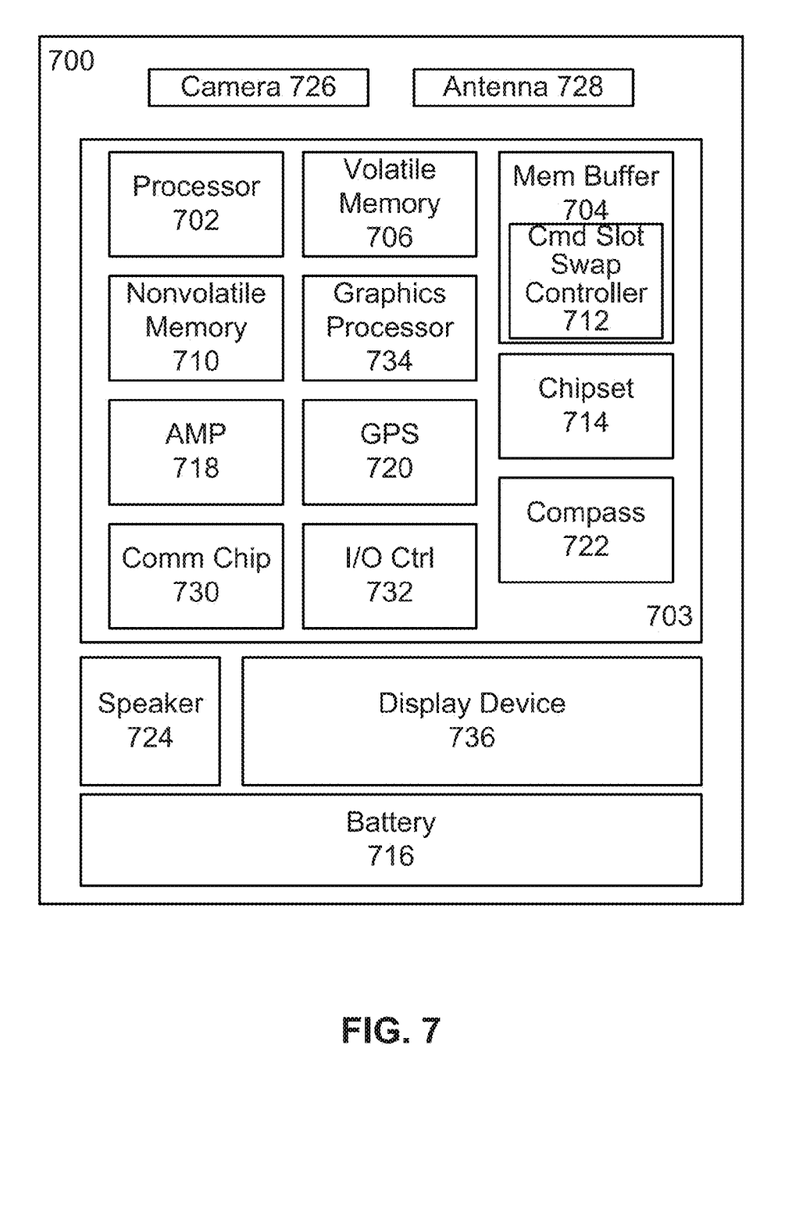
FIG. 7 is a block diagram of a system incorporating a memory buffer having a command slot swap controller.

An embodiment of a system 700 incorporating a memory buffer 704 including a command slot swap controller 712 configured for dynamic command slot swap after clock stop exit is illustrated in FIG. 7. In various embodiments, the system 700 may include more or fewer components, and/or different architectures than that shown in FIG. 7.

In various implementations, the system 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the system 700 may be any other electronic device that processes data.

Although not shown here, the memory buffer 704 may include, for example, one or more components similar to those illustrated for the memory buffer 404 of FIG. 4. For example, the command slot swap controller hub 712 may include a clock sync decoder configured to decode a clock sync command, and a slot detector configured to perform a write pointer exchange in response to detecting misaligned command slots.

In various embodiments, the processor 702 may be physically and electrically coupled with a motherboard 703. Depending on its applications, the system 700 may include other components that may or may not be physically and electrically coupled to the motherboard 703. These other components include, but are not limited to, volatile memory 706 (e.g., dynamic random access memory (DRAM)), non-volatile memory 710 (e.g., read only memory (ROM)), flash memory, a graphics processor 734, a digital signal processor, a crypto processor, a chipset 714, a battery 716, an audio codec, a video codec, a power amplifier 718, a global positioning system (GPS) device 720, a compass 722, an accelerometer, a gyroscope, a speaker 724, a camera 726, an antenna 728, and a mass storage device (such as hard disk drive, compact disk (CD), digital versatile disk (DVD), and so forth).

The system 700 may include at least one communications chip 730 operatively to facilitate communication of the system 700 over one or more networks and/or with any other suitable device. The system 700 may also include at least one I/O controller 732, and in some implementations, the at least one I/O controller 732 may be part of the at least one communication chip 730. In some implementations the at least one communication chip 730 may be part of the processor 702.

The communication chip 730 may enable wireless communications for the transfer of data to and from the system 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 730 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 2G, 3G, 4G, 5G, and beyond. In some implementations, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The system 700 may include a display device 736, such as, for example, a cathode ray tube (CRT), liquid crystal display (LCD), light emitting diode (LED), or other suitable display device. The display device 736 may be a touch screen display supporting touch screen features, and in various one of these embodiments, the I/O controller 732 may include a touchscreen controller. In various embodiments, the display device 736 may be a peripheral device interconnected with the system 700.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus comprising:
    a memory buffer configured to interface with a first memory module over a first channel via a first command slot and with a second memory module over a second channel via a second command slot, receive a clock sync command targeting the first command slot, and perform a write pointer exchange in response to detecting the clock sync command in the second command slot to realign the first command slot and the second command slot.

2. The apparatus of claim 1, wherein the memory buffer is configured to decode the clock sync command and perform the write pointer exchange after exiting a clock stop mode.

3. The apparatus of claim 2, wherein during the clock stop mode, a memory command clock of the apparatus is stopped.

4. The apparatus of claim 1, further comprising memory including the first memory module and the second memory module.

5. The apparatus of claim 1, wherein the memory comprises a double data rate (DDR) memory.

6. The apparatus of claim 5, wherein the DDR memory comprises DDR dynamic random access memory.

7. The apparatus of claim 1, wherein the memory buffer includes a clock sync decoder coupled to a first command bus and a second command bus, and a slot detector coupled to the clock sync decoder for detecting whether the clock sync command is in the first command slot or the second command slot.

8. The apparatus of claim 7, wherein the slot detector is configured to output a swap signal to a write enable controller for performing the write pointer exchange.

9. A system comprising:
a host configured to issue a plurality of memory access commands;
memory including a first memory module configured to receive first memory access commands over a first channel via a first command slot and a second memory module configured to receive second memory access commands over a second channel via a second command slot;
a memory buffer configured to receive a clock sync command from the host targeting the first command slot, and perform a write pointer exchange in response to detecting the clock sync command in the second command slot to realign the first command slot and the second command slot; and
a display device operatively coupled to the host.

10. The system of claim 9, wherein the host is configured to drive a core clock and a memory command clock.

11. The system of claim 10, wherein the host is configured to selectively disable the memory command clock in a clock stop mode.

12. The system of claim 11, wherein the memory buffer is configured to decode the clock sync command and perform the write pointer exchange after exiting the clock stop mode.

13. The system of claim 9, further comprising a network interface operatively coupled with the host, and configured to communicatively couple the system with a network.

14. The system of claim 9, wherein the system is a selected one of a laptop, a netbook, a notebook, an ultrabook, a smartphone, a tablet, a personal digital assistant, an ultra mobile PC, a mobile phone, a desktop computer, a server, a printer, a scanner, a monitor, a set-top box, an entertainment control unit, a digital camera, a portable music player, or a digital video reorder.

15. The system of claim 9, wherein the display device is a touch screen display.

16. The system of claim 9, wherein the host includes one or more processors.

17. A method comprising:
resuming a memory command clock;
receiving a clock sync command targeting a first command slot; and
performing a write pointer exchange in response to detecting the clock sync command in a second command slot to realign the first command slot and the second command slot.

18. The method of claim 17, wherein the performing the write pointer exchange comprising performing the write point exchange after exiting a clock stop mode.

19. The method of claim 17, further comprising selectively disabling the memory command clock in a clock stop mode.

20. The method of claim 17, further comprising decoding the clock sync command prior to performing the write pointer exchange.

21. The method of claim 17, wherein the performing the write pointer exchange comprises outputting a swap signal by a command slot swap controller to a write enable controller.

22. A non-transitory machine-readable medium having associated instructions that, when executed by a machine, result in operations including:
resuming a memory command clock;
receiving a clock sync command targeting a first command slot; and
performing a write pointer exchange in response to detecting the clock sync command in a second command slot to realign the first command slot and the second command slot.

23. The non-transitory machine-readable medium of claim 22, wherein the performing the write pointer exchange is performed after exiting a clock stop mode.

24. The non-transitory machine-readable medium of claim 22, wherein the operations further include selectively disabling the memory command clock in a clock stop mode.

25. The non-transitory machine-readable medium of claim 22, wherein the operations further include decoding the clock sync command prior to performing the write pointer exchange.

* * * * *

UNITED STATES PATENT AND TRADEMARK OFFICE
CERTIFICATE OF CORRECTION

| | | |
|---|---|---|
| PATENT NO. | : 8,787,110 B2 | Page 1 of 1 |
| APPLICATION NO. | : 13/537688 | |
| DATED | : July 22, 2014 | |
| INVENTOR(S) | : Tuan M. Quach | |

It is certified that error appears in the above-identified patent and that said Letters Patent is hereby corrected as shown below:

In the Claims

Claim 14, column 8
Line 4 reads "a video reorder" should read --a video recorder--.

Claim 18, column 8
Line 19 reads "comprising" should read --comprises--.

Signed and Sealed this
Third Day of November, 2015

Michelle K. Lee
*Director of the United States Patent and Trademark Office*